United States Patent
Tomaru et al.

(10) Patent No.: US 10,250,205 B2
(45) Date of Patent: Apr. 2, 2019

(54) POWER AMPLIFYING DEVICE

(71) Applicant: HITACHI KOKUSAI ELECTRIC INC., Tokyo (JP)

(72) Inventors: Kenya Tomaru, Tokyo (JP); Manabu Nakamura, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/736,327

(22) PCT Filed: Jun. 9, 2016

(86) PCT No.: PCT/JP2016/067221
§ 371 (c)(1),
(2) Date: Dec. 14, 2017

(87) PCT Pub. No.: WO2016/208410
PCT Pub. Date: Dec. 29, 2016

(65) Prior Publication Data
US 2018/0191316 A1 Jul. 5, 2018

(30) Foreign Application Priority Data

Jun. 22, 2015 (JP) ................................. 2015-124889

(51) Int. Cl.
*H03F 3/21* (2006.01)
*H03F 3/217* (2006.01)
(Continued)

(52) U.S. Cl.
CPC ........... *H03F 3/2173* (2013.01); *H03F 3/217* (2013.01); *H03F 3/2175* (2013.01); *H03F 3/24* (2013.01);
(Continued)

(58) Field of Classification Search
CPC .................................................... H03F 3/2173
See application file for complete search history.

(56) References Cited

U.S. PATENT DOCUMENTS 8,878,622 B2 * 11/2014 Singerl .................. H03F 3/187
332/109
8,971,398 B2 * 3/2015 Singerl ................ H03F 1/0277
332/109
(Continued)

FOREIGN PATENT DOCUMENTS

JP 2003-229770 A 8/2003
JP 2004-538701 A 12/2004
(Continued)

OTHER PUBLICATIONS

Written Opinion of the International Searching Authority in corresponding International Application No. PCT/JP2016/067221, dated Sep. 6, 2016.
(Continued)

*Primary Examiner* — Patricia T Nguyen
(74) *Attorney, Agent, or Firm* — Bacon & Thomas, PLLC

(57) ABSTRACT

An outphasing power amplifying device includes a switching signal generating circuit configured to generate a switching pulse signal for switching a class-D power amplifier from two types of sinusoidal wave generated based on amplitude and phase of a modulated wave to be transmitted. The switching signal generating circuit includes: a sin calculation unit and a cos calculation unit for converting phase information of the two types of sinusoidal wave into a quadrature format; a DA converter for converting the quadrature-format phase information; a first filter for removing an aliasing component from the analogue signal; an analogue quadrature modulator for generating a sinusoidal wave from the analogue signals by using a local signal; a second filter for allowing a radio frequency and a component in the vicinity thereof to pass therethrough; and a comparator for converting the sinusoidal wave into a switching pulse signal by comparison with a reference voltage.

4 Claims, 6 Drawing Sheets

(51) Int. Cl.
*H03F 3/24* (2006.01)
*H03K 5/02* (2006.01)
*H03M 1/06* (2006.01)
*H04L 27/36* (2006.01)

(52) U.S. Cl.
CPC ............ *H03K 5/02* (2013.01); *H03M 1/0629* (2013.01); *H04L 27/362* (2013.01)

(56) References Cited

U.S. PATENT DOCUMENTS

| | | |
|---|---|---|
| 2004/0232978 A1 | 11/2004 | Easson et al. |
| 2005/0215209 A1* | 9/2005 | Tanabe .................. H03F 1/0211 455/127.1 |
| 2011/0148518 A1* | 6/2011 | Lejon .................... H03F 1/0205 330/124 R |
| 2014/0203871 A1* | 7/2014 | Pamarti ................. H03F 1/0294 330/251 |
| 2014/0218104 A1 | 8/2014 | Kunihiro |
| 2015/0236727 A1* | 8/2015 | Maeda ................ H04L 27/2089 375/297 |

FOREIGN PATENT DOCUMENTS

| | | |
|---|---|---|
| JP | 2011-86983 A | 4/2011 |
| JP | 2011-086983 A | 4/2011 |
| WO | 03/015263 A1 | 2/2003 |
| WO | 2013/042754 A1 | 3/2013 |

OTHER PUBLICATIONS

International Preliminary Report of Patentability in corresponding International Application No. PCT/JP2016/067221, dated Dec. 26, 2017.

* cited by examiner

POWER AMPLIFYING DEVICE

FIELD OF THE INVENTION

The present invention relates to a power amplifying method in wireless communication; and, more particularly, to a power amplifying device using a class-D power amplifier.

BACKGROUND OF THE INVENTION

Outphasing power amplification is highly effective power amplification using a class-D power amplifier (see, e.g., Patent Document 1).

An outline of the outphasing power amplification will be described with reference to FIG. 4. FIG. 4 shows an outphasing power amplifying device using a full-bridge class-D power amplifier.

In FIG. 4, switching signals generated based on modulated wave signals to be transmitted are inputted to four gate terminals G1 to G4. As a result, a square-wave-shaped signal is outputted as an output of a class-D power amplifier 101. This output signal contains a desired modulated wave signal and a high frequency component. Therefore, filtering is performed at a subsequent stage of the class-D power amplifier 101 by using a filter 102 and the desired modulated wave signal is extracted.

Hereinafter, switching signals inputted to four gate terminals G1 to G4 shown in FIG. 4 will be described with reference to FIG. 5. FIG. 5 shows examples of the switching signals applied to the gate terminals G1 to G4. In FIG. 5, (a) shows a switching signal inputted to the gate terminal G1, (b) shows a switching signal inputted into the gate terminal G3, (c) shows an output signal of an amplifier at A point in FIG. 4, and (d) shows a filter output signal at B point in FIG. 4.

Here, the case of AM modulation is illustrated for simple description. A notation T in the drawing indicates a cycle of a carrier wave.

As shown in FIG. 5, at A point in FIG. 4, the ouput signal becomes positive when G1 and G4 are ON and G3 and G2 are OFF, whereas the ouput signal becomes negative when G1 and G4 are OFF and G3 and G2 are ON. By controlling the change timing of G1 and G2 (=–G1) and that of G3 and G4 (=–G3) based on the above features, the waveform of the square-wave-shaped signal at A point is changed.

Next, a method for generating the switching signals inputted to the four gate terminals G1 to G4 shown in FIG. 4 will be described with reference to FIG. 6. FIG. 6 is a block diagram showing a configuration of a switching signal generating circuit for generating switching signals applied to the four gate terminals G1 to G4 shown in FIG. 4.

As shown in FIG. 6, a conventional switching signal generating circuit includes a modulation unit 1, an interpolation unit 2, an amplitude calculation unit 3, an amplitude-phase conversion unit 4, a multiplier 5, a phase calculation unit 6, an adder 7, a normalization unit 18, an ON period calculation unit 19, a quantization unit 20, a counter 21, a comparison unit 22 and an inversion unit 23.

In the conventional switching signal generating circuit, first, the modulation unit 1 generates a modulated signal to be transmitted and the interpolation unit 2 upsamples the modulated signal to a rate of a carrier wave frequency (or a frequency close thereto).

After the upsampling in the interpolation unit 2, the amplitude calculation unit 3 and the phase calculation unit 6 converts each sample into a polar form (amplitude value, phase value).

After the conversion into the polar form, the amplitude-phase conversion unit 4 converts the amplitude value into an angle value $\phi$. The relative relationship of the control pulses for G1 and G3 is controlled by the angle value $\phi$. Further, the relative relationship is controlled by advancing the control pulse for G1 by $\phi/2$ and delaying the control pulse for G3 by $\phi/2$. Therefore, the angle value $\phi$ is reduced to a half by the multiplier 5.

Next, the adder 7 generates a phase of a control pulse for G1 ($\theta+\phi/2$) and a phase of a control pulse for G3 ($\theta-\phi/2+\pi$) by using the angle value $\phi/2$ obtained from the multiplier 5 and the phase value $\theta$ obtained from the phase calculation unit 6.

The phases generated for G1 and G3 are converted to pulse signals for switching by the normalization unit 18, the ON period calculation unit 19, the quantization unit 20, the counter 21, the comparison unit 22 and the inversion unit 23.

The counter 21 updates the value at a cycle sufficiently shorter than the carrier wave cycle and the value of the counter 21 returns to the original value at a carrier wave cycle. (For example, the counter 21 repeats an operation of counting up the value from 0 to 63 by one at a $\frac{1}{64}$ cycle of the carrier wave cycle and returning the value to 0.)

A reference for determining the count value is calculated by the normalization unit 18, the ON period calculation unit 19 and the quantization unit 20. First, the normalization unit 18 normalizes a phase of 0 to $2\pi$ to a range of 0 to 1. Next, the ON period calculation unit 19 determines an ON period within a range from 0 to 1. (For example, when $\theta=0$ and $\phi/2=0$, an ON period for G1 and G2 (=–G1) becomes 0 to 0.5 and an ON period for G3 and G4 (=–G3) becomes 0.5 to 1; and when $\theta=0$ and $\phi/2=\pi/4$, an ON period for G1 and G2 (=–G1) becomes 0 to 0.375 and 0.875 to 1 and an ON period for G3 and G4 (=–G3) becomes 0 to 0.125 and 0.625 to 1.) The quantization unit 20 quantizes the determination reference value based on a word length of a value of the counter. (For example, in comparison with the six-bit counter (0 to 63), an output of the ON period calculation unit 19 is multiplied by 64 and rounded off to the nearest tenth.) Accordingly, the on/off of the respective switching signals are switched based on the value of the counter 21.

Patent Document 1: Japanese Patent Application Publication No. 2004-48703

In a conventional case, the accuracy of on/off timing of a switching signal is affected by processing resolution in the carrier wave cycle T. Specifically, the available number of timings is limited to the number of states expressed by the counter 21 in FIG. 6 and the quantization in a time axis direction is additionally required during the control. As a result of the quantization, a difference between an output waveform of a class-D power amplifier and an output waveform obtained from ideal switching is generated. The effect of the difference is monitored as a noise in and out of a band of a modulated wave even after final filtering and various characteristics such as spurious characteristics in the out-of-band region, EVM (Error Vector Magnitude) and the like deteriorate.

Therefore, the updating process in the counter 21 and the comparison process in the comparison unit 22 shown in FIG. 6 need to be performed by a sufficiently high operating clock which can achieve acceptably low noise level.

However, at the same time, it is not possible to unconditionally increase the operating clock of the digital circuit due to the limit of the radio frequency. For example, the logic has an operating clock of 6.4 GHz only by controlling the switching signal by the resolution of ¹⁄₆₄ of the cycle of 100 MHz on the assumption that the radio frequency (carrier wave frequency) is 100 MHz. When the high operating clock is necessary, it is difficult to realize hardware.

SUMMARY OF THE INVENTION

In view of the above, the present invention provides a power amplifying device capable of, in a switching signal generating process, eliminating constraints on an operating clock of a digital circuit in generating a pulse and increasing a radio frequency range to which outphasing power amplification can be applied.

In accordance with an aspect, there is provided an outphasing power amplifying device including a full-bridge class-D power amplifier, comprising: a switching signal generating circuit configured to generate a switching pulse signal for switching the class-D power amplifier from two types of sinusoidal wave generated based on an amplitude and a phase of a modulated wave to be transmitted, wherein the switching signal generating circuit includes: a sin calculation unit and a cos calculation unit which are configured to convert phase information of the two types of sinusoidal wave into a quadrature format; a DA converter configured to convert the quadrature-format phase information from each of the sin calculation unit and the cos calculation unit into an analogue signal; a first filter configured to remove an aliasing component from the analogue signal inputted from the DA converter; an analogue quadrature modulator configured to generate a sinusoidal wave from the analogue signals inputted from the first filter by using a local signal; a second filter configured to allow a predetermined radio frequency and a component in the vicinity thereof in the sinusoidal wave inputted from the analogue quadrature modulator to pass therethrough; and a comparator configured to convert the sinusoidal wave inputted from the second filter into a switching pulse signal by comparison with a reference voltage.

In the power amplifying device, the quadrature-format phase information is updated at a predetermined interval based on the modulated wave to be transmitted.

In accordance with another aspect, there is provided an outphasing power amplifying device including a full-bridge class-D power amplifier, comprising: a switching signal generating circuit configured to generate a switching pulse signal for switching the class-D power amplifier from two types of sinusoidal wave generated based on an amplitude and a phase of a modulated wave to be transmitted, wherein the switching signal generating circuit includes: a DDS (Direct Digital Synthesizer) configured to update a phase accumulator at a predetermined frequency based on phase information of the two types of sinusoidal wave and output an amplitude value of a sinusoidal wave corresponding to the phase of the phase accumulator; a DA converter configured to convert the amplitude value of the sinusoidal wave inputted from the DDS into an analogue signal; a second filter configured to remove an aliasing component from the analogue signal inputted from the DA converter; and a comparator configured to convert the analogue signal inputted from the second filter into a switching pulse signal by comparison with a reference voltage.

In the power amplifying device, a phase shift value added to an output of the phase accumulator is updated at a predetermined interval based on the modulated wave to be transmitted.

Effect of the Invention

In accordance with the present invention, in the switching signal generating process, it is possible to eliminate constraints on an operating clock of a digital circuit in generating a pulse and increase a radio frequency range to which outphasing power amplification can be applied.

DETAILED DESCRIPTION OF THE EMBODIMENTS

First Embodiment

Figure 1:
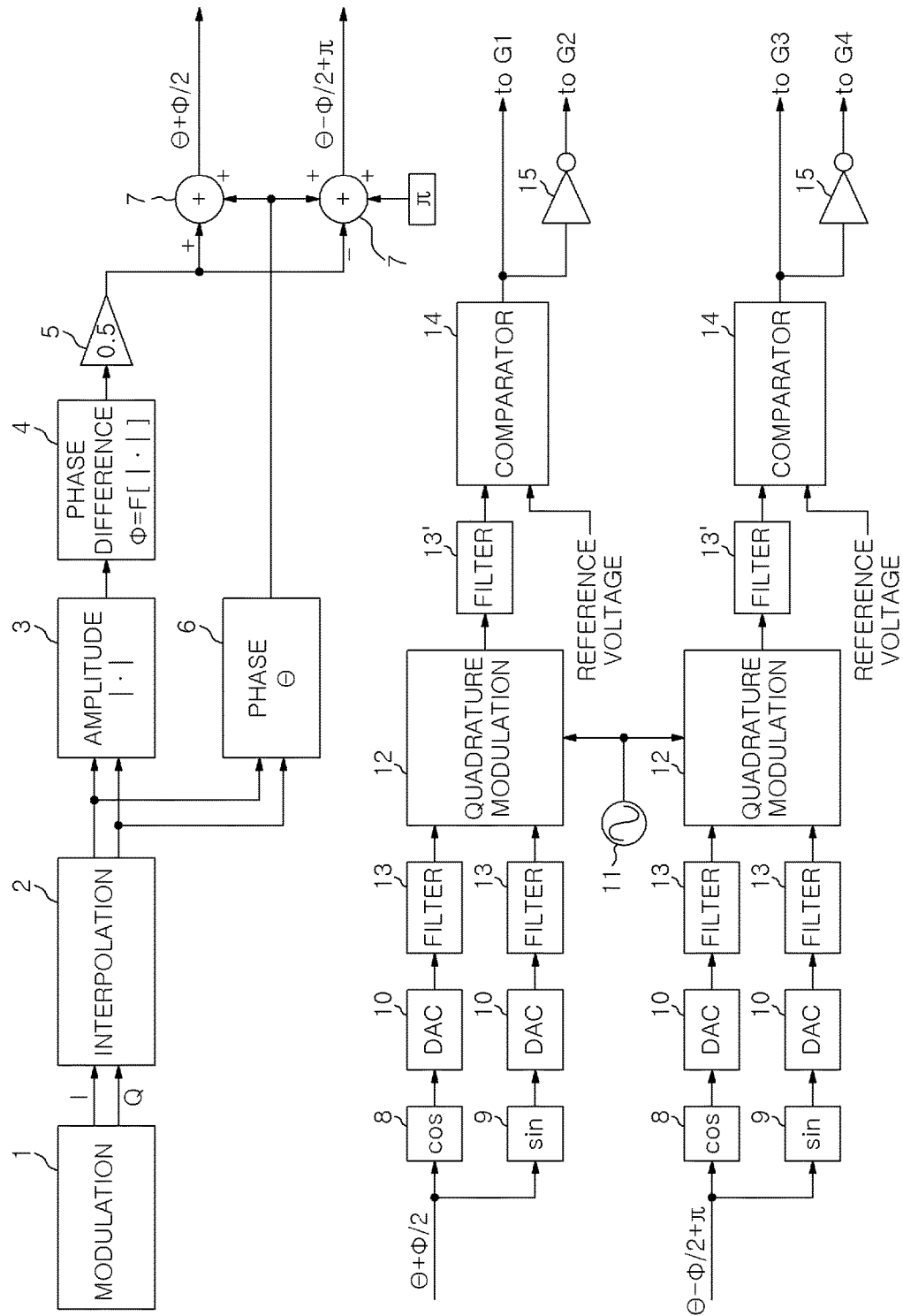
FIG. 1 is a block diagram showing an example of a configuration of a switching signal generating circuit of a power amplifying device according to a first embodiment of the present invention.
Figure 6:
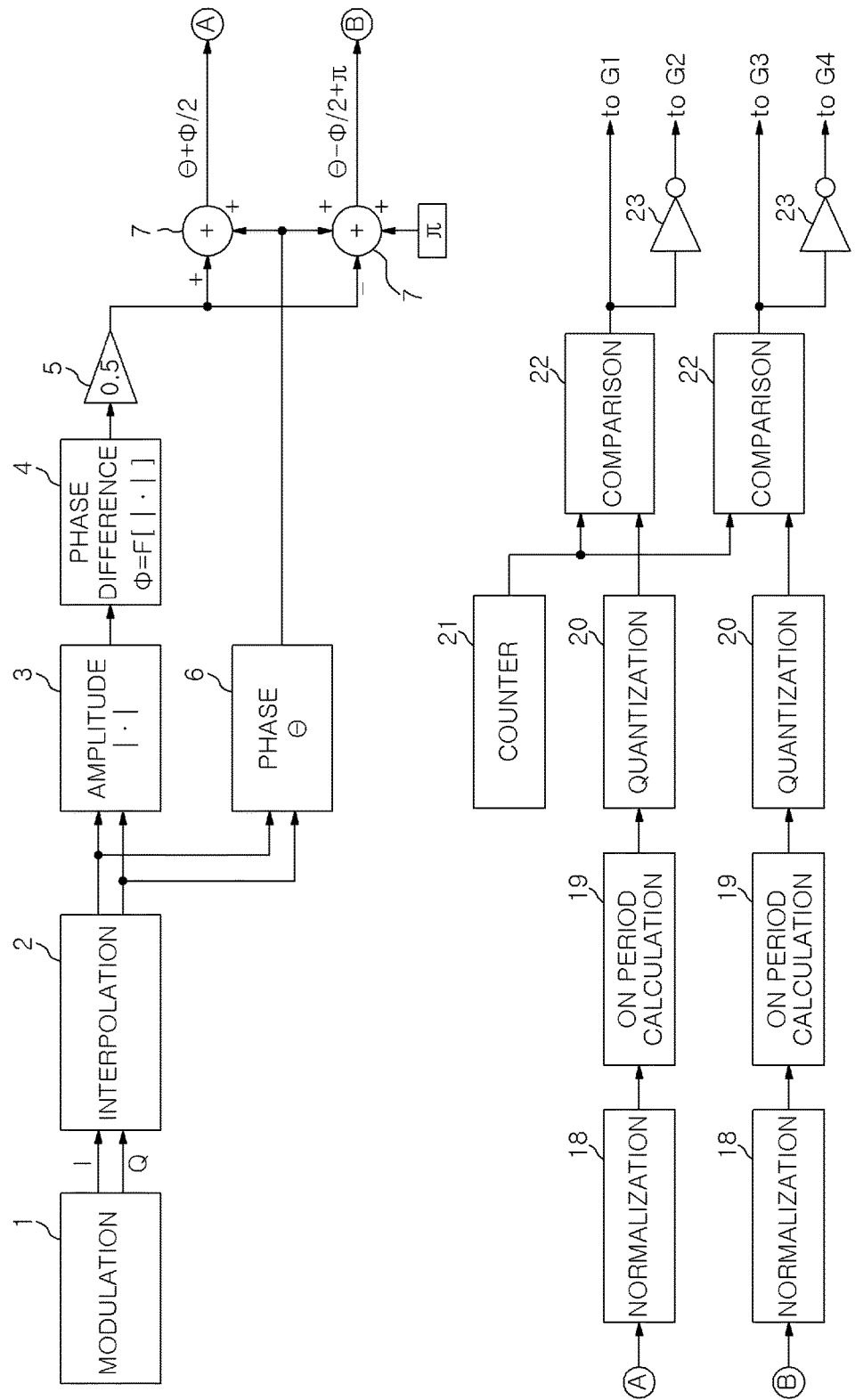
FIG. 6 is a block diagram showing a configuration of a switching signal generating circuit for generating the switching signals applied to the four gate terminals G1 to G4 shown in FIG. 4.

Hereinafter, a power amplifying device according to a first embodiment of the present invention will be described with reference to the accompanying drawings. FIG. 1 is a block diagram showing an example of a configuration of a switch signal generating circuit of a power amplifying device according to the first embodiment of the present invention. In the first embodiment, it is assumed that a switching signal generated by the switch signal generating circuit is connected to a full-bridge class-D power amplifier shown in FIG. 4. Like reference numerals will be used for like parts in FIGS. 1 and 6.

As shown in FIG. 1, the switching signal generating circuit of the first embodiment includes a modulation unit 1, an interpolation unit 2, an amplitude calculation unit 3, an amplitude-phase conversion unit 4, a multiplier 5, a phase calculation unit 6, an adder 7, a cos calculation unit 8, a sin calculation unit 9, a DA converter 10, a filter 13, a local signal generator 11, an analogue quadrature modulator 12, a filter 13', a comparator 14 and an inversion unit 15. In the conventional switching signal generating circuit of the first embodiment, first, the modulation unit 1 generates a modulated signal to be transmitted and the interpolation unit 2 upsamples the modulated signal to a rate of a carrier wave frequency (or a frequency close thereto).

After the upsampling in the interpolation unit 2, the amplitude calculation unit 3 and the phase calculation unit 6 converts each sample into a polar form (amplitude value, phase value).

After the conversion into the polar form, the amplitude-phase conversion unit 4 converts the amplitude value into an angle value $\phi$. The relative relationship of the control pulses for G1 and G3 is controlled by the angle value $\phi$. Further, the relative relationship is controlled by advancing the control pulse for G1 by ϕ/2 and delaying the control pulse for G3 by ϕ/2. Therefore, the angle value ϕ is reduced to a half by the multiplier 5. At this time, the conversion is performed such that a desired amplitude can be reproduced after the filtering in the filter 102 shown in FIG. 4.

The adder 7 generates a phase of a control pulse for G1 (θ+ϕ/2) and a phase of a control pulse for G3 (θ−ϕ/2+π) by using the angle value ϕ/2 obtained from the multiplier 5 and the phase value θ obtained from the phase calculation unit 6. The updating rate of the phase information is determined based on the result of the upsampling in the interpolation unit 2.

The cos calculation unit 8 and the sin calculation unit 9 convert the respective phase information into a quadrature format. The DA converter 10 converts the result into analog signals. A known technique is used for processing in the cos calculation unit 8 and the sin calculation unit 9 and it is not an essential part of the present invention, so that the description thereof will be omitted.

The respective phase information of the quadrature format are inputted into the analogue quadrature modulator 12 after the aliasing component is removed by the filter 13. As for a signal source of the local signal of the analogue quadrature modulator 12, the local signal generator 11 for outputting a desired radio frequency is also used.

The output of the analogue quadrature modulator 12 is inputted to the comparator 14 through the filter 13' that allows the radio frequency and components in the vicinity thereof to pass. The filter 13' preferably has a group delay dθ/dω of about zero in the radio frequency. For example, the filter 13' is designed as an LPF having Bessel's characteristics in which the phase change is smooth.

In the comparator 14, the output of the filter 13' is compared with the reference voltage and the sinusoidal wave is converted into a switching pulse signal. When the DC component of the output of the filter 13' is completely removed, a duty ratio of the generated pulse signal can become 50% by setting the reference voltage to 0V.

Figure 4:
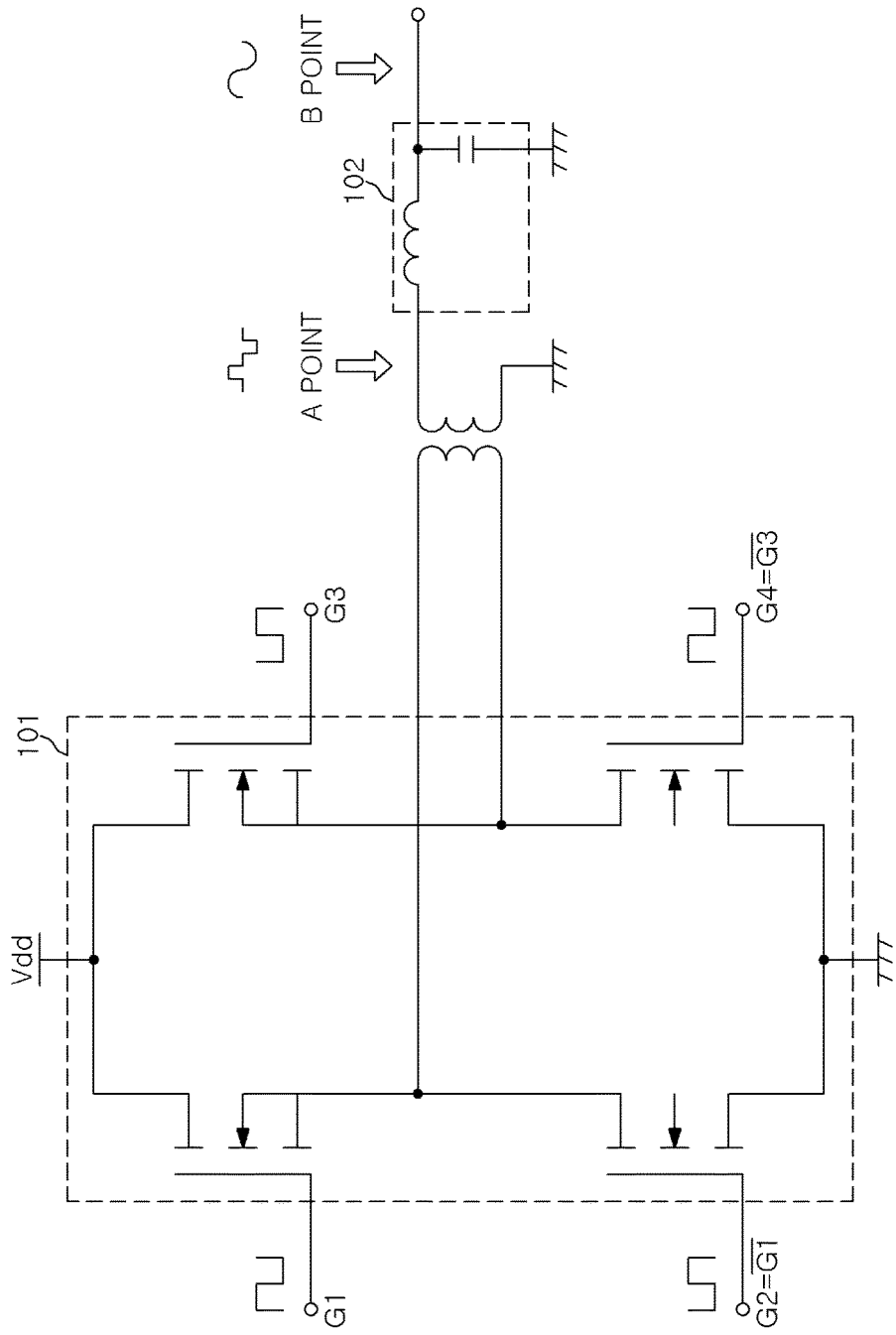
FIG. 4 shows an outphasing power amplifying device using a full-bridge class-D power amplifier.
Figure 5:
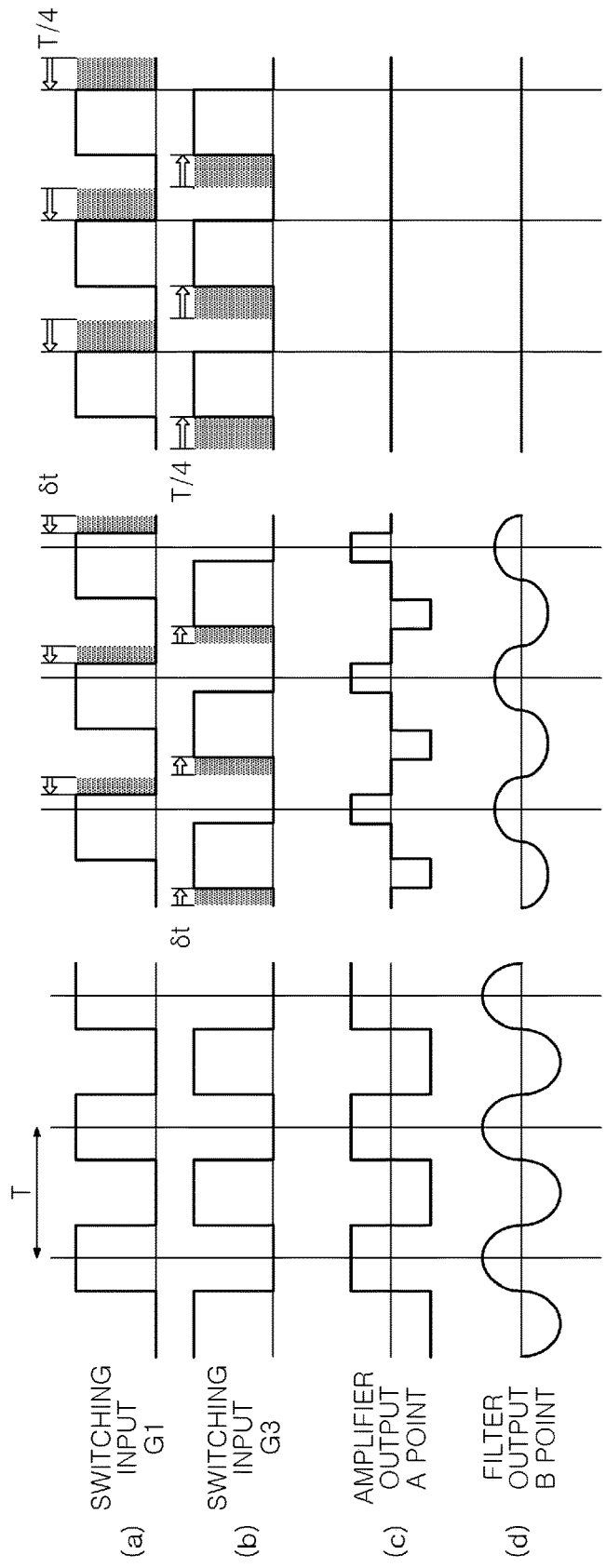
FIG. 5 shows an example in which switching signals are applied to four gate terminals G1 to G4.

In FIG. 4, the polarities of the signals applied to the G1 and G2 terminals and the G3 and G4 terminals basically have the relationship in which one is "ON" and the other is "OFF". Therefore, the inversion unit 15 performs an inversion process corresponding to G2=−G1 and G4=−G3.

As described above, in accordance with the power amplifying device of the first embodiment of the present invention, in the switching signal generating process, it is possible to eliminate constraints on the operating clock of the digital circuit in generating a pulse and increase the radio frequency range to which the outphasing power amplification can be applied.

Second Embodiment

Figure 2:
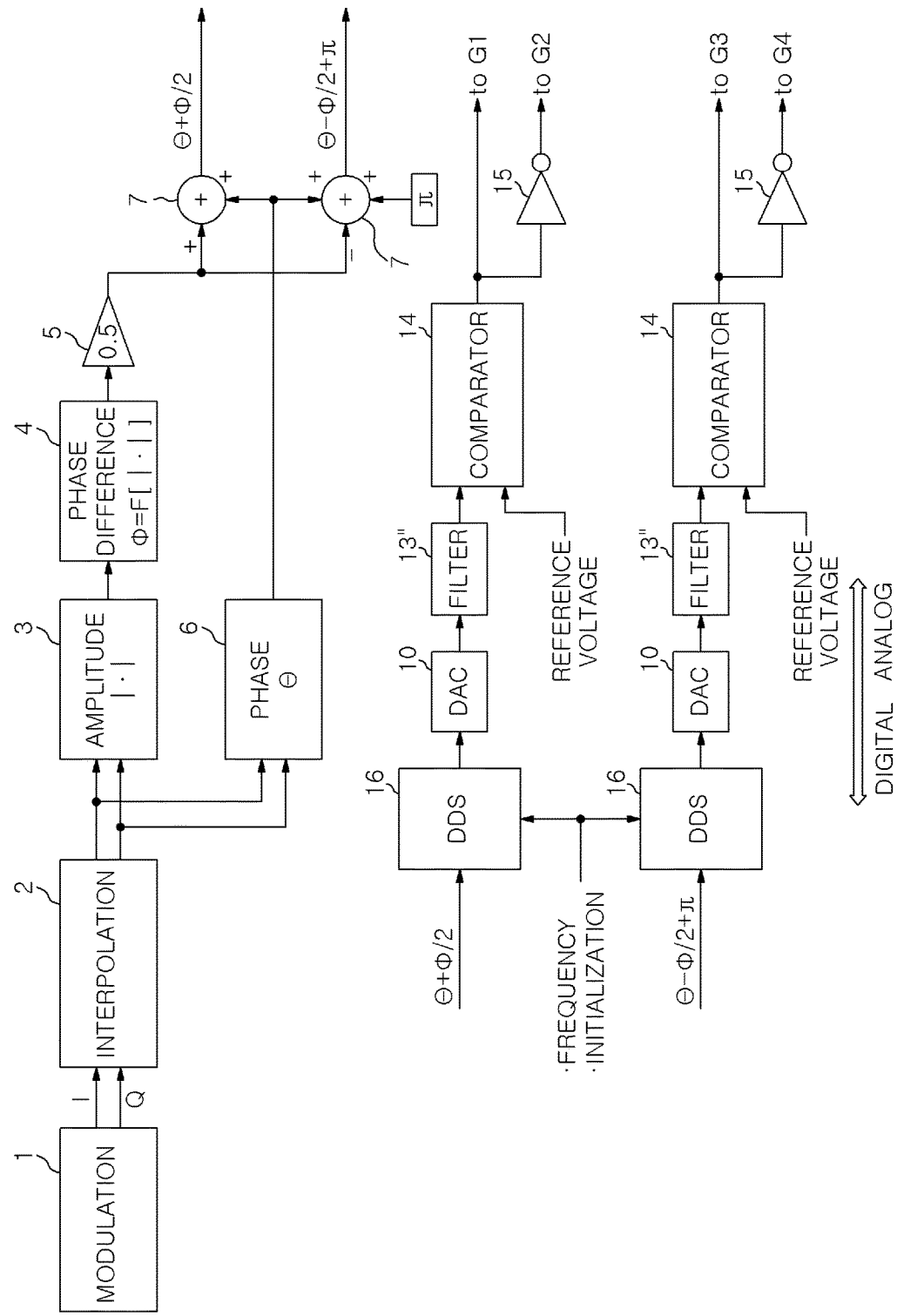
FIG. 2 is a block diagram showing an example of a configuration of a switching signal generating circuit of a power amplifying device according to a second embodiment of the present invention.

Hereinafter, a power amplifying device according to a second embodiment of the present invention will be described with the accompanying drawings. FIG. 2 is a block diagram showing an example of a configuration of the switching signal generating circuit according to the second embodiment of the present invention. In the second embodiment, it is assumed that a switching signal generated in the switching signal generating circuit is connected to the full-bridge class-D power amplifier shown in FIG. 4. Like reference numerals will be used for like parts shown in FIGS. 1, 2 and 6.

As shown in FIG. 2, the switching signal generating circuit of the second embodiment includes a modulation unit 1, an interpolation unit 2, an amplitude calculation unit 3, an amplitude-phase conversion unit 4, a multiplier 5, a phase calculation unit 6, an adder 7, a DDS (Direct Digital Synthesizer) 16, a DA converter 10, a filter 13", a comparator 14 and an inversion unit 15.

In the switching signal generating circuit of the second embodiment, the processes up to the generation of two types of phase information in the adder 7 and the processes performed after the filter 13" are the same as those in the switching signal generating circuit of the first embodiment. Therefore, redundant description will be omitted.

The respective phase information are inputted to the DDS 16. The DDS is a general term for a process of updating a phase accumulator at a set frequency (phase update amount) and outputting an amplitude value of a sinusoidal wave corresponding to the content (phase) of the phase accumulator, as shown in FIG. 3.

Figure 3:
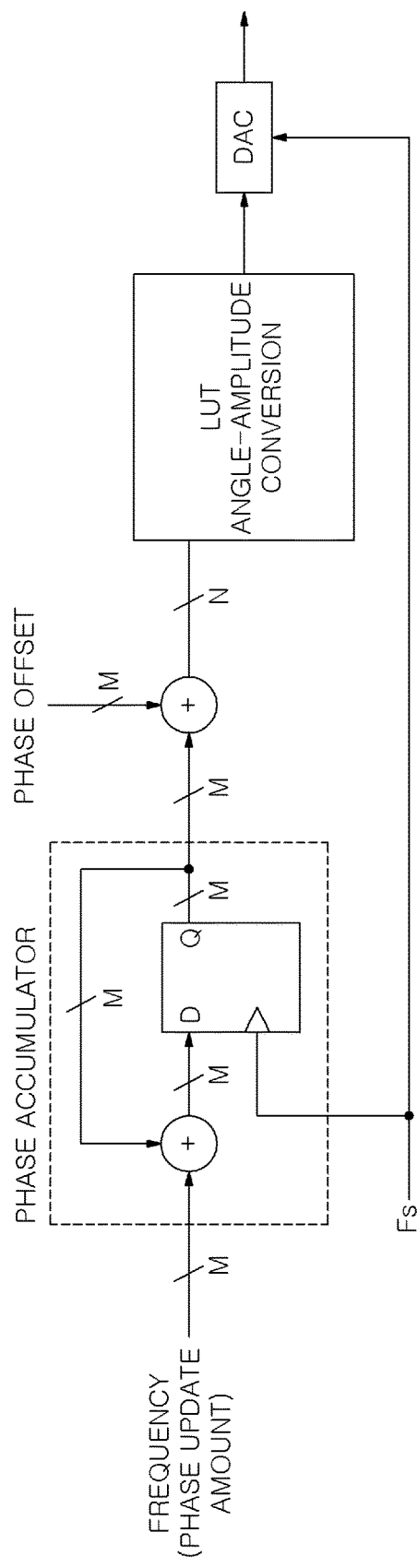
FIG. 3 is a block diagram showing a basic configuration of DDS.

In the second embodiment, there is used the DDS having a configuration in which the DAC shown in FIG. 3 is not included. In other words, the second embodiment has a configuration in which the processes up to the generation of the sinusoidal wave are performed by FPGA or the like.

Two DDSs 16 are initialized at the same timing and perform processes in a state where phase accumulation values are made to be equal to each other. The phase value obtained by the adder 7 is used for offsetting the phase accumulation values in the respective DDSs 16.

As described above, in accordance with the power amplifying device of the second embodiment of the present invention, in the switching signal generating process, it is possible to eliminate constraints on the operating clock of the digital circuit in generating a pulse and increase the radio frequency range to which the outphasing power amplification can be applied.

The present invention is not limited to the above-described embodiment, and may be embodied with modifications of the constituent elements within the scope of the invention. Further, various inventions can be made by appropriately combining the constituent elements disclosed in the embodiment. For example, some of all the constituent elements disclosed in the embodiment may be omitted.

INDUSTRIAL APPLICABILITY

The present invention is used in the industry for manufacturing a power amplifying device using a class-D power amplifier.

| Description of Reference Numerals | |
|---|---|
| 1: modulation unit | 2: interpolation unit |
| 3: amplitude calculation unit | |
| 4: amplitude-phase converting unit | |
| 5: multiplier | 6: phase calculation unit |
| 7: adder | 8: cos calculation unit |
| 9: sin calculation unit | |
| 10: DA converter | 11: local signal generator |
| 12: analogue quadrature modulator | |
| 13, 13', 13": filter | |
| 14: comparator | 15: inversion unit |
| 16: DDS | 18: normalization unit |
| 19: ON period calculation unit | |
| 20: quantization unit | |
| 21: counter | 22: comparison unit |
| 23: inversion unit | 101: class-D power amplifier |
| 102: filter | |

What is claimed is:
1. An outphasing power amplifying device including a full-bridge class-D power amplifier, comprising:

a switching signal generating circuit configured to generate a switching pulse signal for switching the class-D power amplifier from two types of sinusoidal wave generated based on an amplitude and a phase of a modulated wave to be transmitted, wherein the switching signal generating circuit includes:

a sin calculation unit and a cos calculation unit which are configured to convert phase information of the two types of sinusoidal wave into a quadrature format;

a DA converter configured to convert the quadrature-format phase information from each of the sin calculation unit and the cos calculation unit into an analogue signal;

a first filter configured to remove an aliasing component from the analogue signal inputted from the DA converter;

an analogue quadrature modulator configured to generate a sinusoidal wave from the analogue signals inputted from the first filter by using a local signal;

a second filter configured to allow a predetermined radio frequency and a component in the vicinity thereof in the sinusoidal wave inputted from the analogue quadrature modulator to pass therethrough; and a comparator configured to convert the sinusoidal wave inputted from the second filter into a switching pulse signal by comparison with a reference voltage.

2. The power amplifying device of claim 1, wherein the quadrature-format phase information is updated at a predetermined interval based on the modulated wave to be transmitted.

3. An outphasing power amplifying device including a full-bridge class-D power amplifier, comprising:

a switching signal generating circuit configured to generate a switching pulse signal for switching the class-D power amplifier from two types of sinusoidal wave generated based on an amplitude and a phase of a modulated wave to be transmitted, wherein the switching signal generating circuit includes:

a DDS (Direct Digital Synthesizer) configured to update a phase accumulator at a predetermined frequency based on phase information of the two types of sinusoidal wave and output an amplitude value of a sinusoidal wave corresponding to the phase of the phase accumulator;

a DA converter configured to convert the amplitude value of the sinusoidal wave inputted from the DDS into an analogue signal;

a second filter configured to remove a clock component from the analogue signal inputted from the DA converter; and a comparator configured to convert the analogue signal inputted from the second filter into a switching pulse signal by comparison with a reference voltage.

4. The power amplifying device of claim 3, wherein a phase shift value added to an output of the phase accumulator is updated at a predetermined interval based on the modulated wave to be transmitted.

* * * * *